United States Patent
Moriguchi et al.

(10) Patent No.: US 10,428,416 B2
(45) Date of Patent: Oct. 1, 2019

(54) COATING FILM, MANUFACTURING METHOD FOR SAME, AND PVD DEVICE

(71) Applicants: NIPPON ITF, INC., Kyoto (JP); NIPPON PISTON RING CO., LTD., Saitama (JP)

(72) Inventors: Hideki Moriguchi, Kyoto (JP); Tadashi Saito, Tochigi (JP); Yoshikazu Tanaka, Kyoto (JP); Tetsumi Arahi, Kyoto (JP); Katsuaki Ogawa, Saitama (JP); Takahiro Okazaki, Saitama (JP); Hiroyuki Sugiura, Saitama (JP); Yoshihiro Ito, Saitama (JP)

(73) Assignees: NIPPON ITF, INC., Kyoto (JP); NIPPON PISTON RING CO., LTD., Saitama (JP)

( * ) Notice: Subject to any disclaimer, the term of this patent is extended or adjusted under 35 U.S.C. 154(b) by 203 days.

(21) Appl. No.: 15/511,639

(22) PCT Filed: Sep. 17, 2014

(86) PCT No.: PCT/JP2014/074599
§ 371 (c)(1),
(2) Date: Mar. 16, 2017

(87) PCT Pub. No.: WO2016/042630
PCT Pub. Date: Mar. 24, 2016

(65) Prior Publication Data
US 2017/0283935 A1 Oct. 5, 2017

(51) Int. Cl.
*C23C 14/06* (2006.01)
*B82Y 40/00* (2011.01)
(Continued)

(52) U.S. Cl.
CPC .......... *C23C 14/0605* (2013.01); *B82Y 40/00* (2013.01); *C01B 32/05* (2017.08);
(Continued)

(58) Field of Classification Search
USPC ......... 428/217, 408; 204/192, 192.1, 192.15, 204/192.16, 192.38, 192.41
See application file for complete search history.

(56) References Cited

U.S. PATENT DOCUMENTS

| 5,614,314 A * | 3/1997 | Itoh | G11B 5/72 204/192.2 |
| 5,679,454 A * | 10/1997 | Hiwatashi | G11B 5/72 204/192.16 |

(Continued)

FOREIGN PATENT DOCUMENTS

| CN | 1390667 | 1/2003 |
| CN | 1819885 | 8/2006 |

(Continued)

OTHER PUBLICATIONS

"Office Action of China Counterpart Application," dated Jul. 27, 2018, with English translation thereof, p. 1-p. 12.

(Continued)

*Primary Examiner* — Archene A Turner
(74) *Attorney, Agent, or Firm* — JCIPRNET

(57) ABSTRACT

Provided are a coating film, a manufacturing method for the same, and a PVD device that not only sufficiently improve the balance of low-friction properties and wear resistance, but also improve chipping resistance (defect resistance) and peeling resistance. This coating film coats a substrate surface, wherein a hard carbon layer is formed extending in columns-shape perpendicular to the substrate when observed in a cross-sectional bright-field TEM image, the hard carbon layer is formed using a PVD method, and the (Continued)

ID/IG ratio is 1-6 when the hard carbon layer is measured using Raman spectroscopy, said ratio being the ratio of the Raman spectrum D band peak area intensity and G band peak area intensity.

12 Claims, 5 Drawing Sheets

(51) Int. Cl.
    *C23C 14/02* (2006.01)
    *C23C 14/58* (2006.01)
    *C01B 32/05* (2017.01)
    *C01B 32/15* (2017.01)

(52) U.S. Cl.
    CPC ............ *C01B 32/15* (2017.08); *C23C 14/024* (2013.01); *C23C 14/06* (2013.01); *C23C 14/5833* (2013.01)

(56) References Cited

U.S. PATENT DOCUMENTS

| | | | | |
|---|---|---|---|---|
| 5,776,602 | A * | 7/1998 | Ueda | G11B 5/72 428/408 |
| 6,284,376 | B1 * | 9/2001 | Takenouchi | B32B 15/00 428/408 |
| 6,592,839 | B2 | 7/2003 | Gruen et al. | |
| 6,881,475 | B2 * | 4/2005 | Ohtani | C23C 14/022 428/408 |
| 6,962,751 | B2 * | 11/2005 | Fukui | C04B 41/009 428/408 |
| 7,883,775 | B2 * | 2/2011 | Kazahaya | B23G 5/06 428/408 |
| 2002/0114756 | A1 | 8/2002 | Gruen et al. | |
| 2007/0054125 | A1 * | 3/2007 | Akari | C23C 14/024 428/408 |
| 2007/0074664 | A1 | 4/2007 | Nishimura et al. | |
| 2007/0251815 | A1 | 11/2007 | Lo et al. | |

FOREIGN PATENT DOCUMENTS

| | | |
|---|---|---|
| CN | 102732851 | 10/2012 |
| CN | 203569179 | 4/2014 |
| EP | 1992715 | 11/2008 |
| JP | H10-087396 | 4/1998 |
| JP | 2001-261318 | 9/2001 |
| JP | 2002-327271 | 11/2002 |
| JP | 2003073813 | 3/2003 |
| JP | 2007119908 | 5/2007 |
| JP | 2007-297698 | 11/2007 |
| JP | 2009155689 | 7/2009 |
| JP | 2009-184859 | 8/2009 |
| JP | 2010-229552 | 10/2010 |
| JP | 2011001598 | 1/2011 |
| JP | 2011-020179 | 2/2011 |
| JP | 2011-148686 | 8/2011 |
| JP | 2011-225995 | 11/2011 |
| JP | 2013-528697 | 7/2013 |
| JP | 2013234353 | 11/2013 |
| JP | 2014062326 | 4/2014 |
| WO | 2005011902 | 2/2005 |
| WO | 2005083144 | 9/2005 |

OTHER PUBLICATIONS

"Search Report of Europe Counterpart Application", dated Feb. 28, 2018, p. 1-p. 7.

"International Search Report (Form PCT/ISA/210) of PCT/JP2014/074599", dated Dec. 16, 2014, with English translation thereof, pp. 1-4.

"Office Action of Japan Counterpart Application," with machine English translation thereof, dated Apr. 11, 2017, p. 1-p. 6.

"Office Action of Japan Counterpart Application," with machine English translation thereof, dated Aug. 7, 2017, p. 1-p. 6.

"Office Action of Japan Counterpart Application", dated Jan. 7, 2019, with English translation thereof, p. 1-p. 5.

"Office Action of India Counterpart Application", dated Jan. 7, 2019, with English translation thereof, p. 1-p. 5.

"Office Action of China Counterpart Application", dated Mar. 22, 2019, with English translation thereof, p. 1-p. 12.

* cited by examiner

COATING FILM, MANUFACTURING METHOD FOR SAME, AND PVD DEVICE

CROSS-REFERENCE TO RELATED APPLICATION

This application is a 371 application of the International PCT application serial no. PCT/JP2014/074599, filed on Sep. 17, 2014. The entirety of the abovementioned patent application is hereby incorporated by reference herein and made a part of this specification.

BACKGROUND OF THE INVENTION

1. Field of the Invention

The present invention relates to a coating film, a manufacturing method for the same, and a Physical Vapor Deposition (PVD) device, in particular, to a suitable coating film serving as coating films of various sliding members, a manufacturing method for the same, and a PVD device used in the manufacturing method.

2. Description of Related Art

In recent years, in various industrial fields, especially in the field of automobile, the study of coating surfaces of members requiring slidability such as engine substrates or other mechanical substrates with a hard carbon film is prevalent.

The hard carbon film is generally called with various names such as Diamond Like Carbon (DLC) film, amorphous carbon film, i-carbon film, and diamond-like carbon film, which is not structurally crystalline and is classified as amorphous.

Moreover, regarding the hard carbon film, it is generally considered that single bonds (C—C) as seen in diamond crystals and double bonds (C═C) as seen in graphite crystals are coexisted, in addition to having high hardness, high wear resistance, excellent chemical stability and other characteristics like the diamond crystals, also has low hardness, high lubricity, excellent object adaptability and other characteristics like the graphite crystals. In addition, as it is amorphous, it has excellent flatness and also has low friction when in direct contact with an object material, that is, small friction coefficient or excellent object adaptability.

The characteristics vary significantly depending on a film-forming condition, a sliding condition, and an object material, and a technology that improves those characteristics by controlling the composition, the structure, and surface roughness of the hard carbon film has been put forward.

On the other hand, low-friction properties and wear resistance which are important characteristics for the sliding member are in a trade-off relation, and thus it is difficult to balance these characteristics.

Therefore, the balance of low-friction properties and wear resistance of the coating film is sought to a certain extent by specifying a hard carbon layer upon low hardness, or specifying a coexisted existence state of low-hardness hard carbon and high-hardness hard carbon, or effectively utilizing low-hardness hard carbon, thereby improving the trade-off relation.

However, the present situation is still insufficient to have the low-friction properties and the wear resistance both ways. Also, for the coating film of the sliding member, in addition to the low-friction properties or wear resistance, chipping resistance (defect resistance) or peeling resistance is further required, but the present situation is that improvement of the characteristics is still insufficient.

For example, Patent Document 1 shows that, by alternately stacking a low-hardness hard carbon layer and a high-hardness hard carbon layer, low-friction properties and wear resistance are balanced, but the balance is still insufficient, chipping resistance or peeling resistance is insufficient, the low-hardness hard carbon layer is an amorphous structure that uses carbon as a main component, and contains a graphite cluster formed by a mean diameter of 2 nm, while the high-hardness-hard carbon layer contains a graphite cluster formed by a mean diameter of below 1 nm.

Besides, Patent Document 2 discloses a hard carbon film formed using a plasma Chemical Vapor Deposition (CVD) method that uses carbon and hydrogen as main components and has a surface roughness of Rmax below 0.5 μm, which is an amorphous structure in X-ray diffraction crystallography. As a mixture of clusters of a diamond structure and a graphite structure, low-friction properties and wear resistance are balanced by specifying the number of carbon atoms of each cluster; however, to prevent abnormal growth from reducing surface roughness, two clusters of a diamond structure and a graphite structure are required, the number of atoms of each cluster is substantially 100-2000, and thus, even if it is an amorphous structure in X-ray diffraction, it sometimes also contains crystalline substances if tiny areas are analysed with electron beam diffraction of the cross section of the coating film, the cluster is big in size and is limited in the balance of low-friction properties and wear resistance, and chipping resistance or peeling resistance is insufficient.

Besides, Patent Document 3 discloses a metal member formed by at least configuring a DLC film on an iron-containing metal substrate, and the DLC film, in Raman spectroscopy, has a peak derived from graphite which is observed in a range of a wave number of 1550-1600 cm-1. There are multiple different intensities of the peak coexisted in a film surface, a difference between the maximum and minimum peak intensities is more than one bit (one order of magnitude), and it is shown that, by locally making a high-hardness DLC film and an excellent-lubricity DLC film separately within the same film surface, a film that combines DLC films with different hardness is made in the same surface, to balance low-friction properties and wear resistance, but the sizes of the excellent-hardness DLC film and the excellent-lubricity DLC film in the surface are up to dozens of microns (μm), and thus poor performance caused by parts is easy to occur, and it is difficult to balance low-friction properties and wear resistance uniformly in a sliding surface.

In addition, Patent Document 4 discloses a hard carbon film having a structure that at least one part of $sp^2$ bonding crystals are successively connected in a film thickness direction; however, in order to make the hard carbon film contain crystalline substances, the energy of carbon ions reaching the substrate has to be increased, and the bias voltage during film-forming is reduced to −400 V to −1000 V. However, under such a film-forming condition, the film formed has low hardness and poor wear resistance. Therefore, even if it is suitable for to serve as a conductive member, it cannot be used as a coating film of a sliding member requiring excellent wear resistance.

In addition, Patent Document 5 discloses a nitrogen-containing alignment DLC film in which the amount of carbon having an $sp^2$ hybridized orbital is above 70 atom % and a graphite (002) surface is aligned along a thickness direction, but during film-forming, nitrogen is used in plasma CVD, and the bias voltage is very low to be below −1500 V. Therefore, carbon electrons having an $sp^2$ hybridized orbital is above 70% and the $sp^2/sp^3$ ratio becomes very great to be 2.3-∞, only a coating film with low hardness and poor wear resistance can be obtained, but it still cannot be used as a coating film of the sliding member.

Then, Patent Document 6 proposes an amorphous film, which is a DLC film for a piston ring which has a thickness of at least 10 μm and contains a ta-c type DLC not containing hydrogen, and by doping B, O, and Si, the $sp^3$ ratio in the outer side 1 μm to 3 μm of the ta-c type DLC film is reduced, which has excellent friction during leveling, improves heat resistance under inadequate lubrication environments, and has an effect of inhibiting remains, but still does not sufficiently balance low-friction properties and wear resistance.

PRIOR ART DOCUMENT

Patent Document

Patent Document 1: Japanese Patent Publication Gazette No. 2001-261318
Patent Document 2: Japanese Patent Publication Gazette No. H10-87396
Patent Document 3: Japanese Patent Publication Gazette No. 2009-184859
Patent Document 4: Japanese Patent Publication Gazette No. 2002-327271
Patent Document 5: Japanese Patent Publication Gazette No. 2011-148686
Patent Document 6: Japanese Patent Publication Gazette No. 2013-528697

SUMMARY OF THE INVENTION

Problem to be Solved in the Invention

Like the above, the prior arts are insufficient in balancing low-friction properties and wear resistance, and are also insufficient in improving chipping resistance or peeling resistance.

Therefore, an issue of the present invention is to provide a coating film, a manufacturing method for the same, and a PVD device used in the manufacturing method that not only sufficiently improve the balance of low-friction properties and wear resistance, but also improve chipping resistance (defect resistance) and peeling resistance.

Technical Means of Solving the Problem

In a situation where a hard carbon film is formed as a coating film of a sliding member, a vapor-phase growth method such as a PVD method or a CVD method is always used; in this case, if the substrate temperature becomes high, it is not easy to generate $sp^3$ bonding carbon, while a hard carbon film with poor wear resistance is formed, and, in order to prevent the situation and softening of the substrate, the substrate temperature is controlled to be below 200° C. to carry out film-forming.

However, the inventor has conducted various experiments and researches to solve the issue, and in this case, not limited by the existing concept, a PVD method is used to increase the substrate temperature to form the hard carbon film, which obtains a result that surprises the inventor, that is, in a situation where the substrate temperature is set as above 250° C. and the bias voltage is set as below −275 V to form a hard carbon film, a hard carbon film whose structure is entirely different from the conventional one may be formed.

Specifically, by observing the cross section of the hard carbon film obtained through the bright-field Transmission Electron Microscope (TEM) image, a result is obtained that a hard carbon layer is formed whose crystal growth is in columns-shape perpendicular to the substrate.

Moreover, when sliding characteristics of the columnar hard carbon film are measured, a result is obtained that not only is the compatibility of both low-friction properties and wear resistance originally in the trade-off relation improved more than before, but also chipping resistance (defect resistance) or peeling resistance is also sufficiently improved, and the hard carbon film coating a surface of a sliding member is preferred.

Generally, it is considered that the reasons for achieving such an effect are as follows.

In the bright-field TEM image, the columnar hard carbon layer has a relatively black portion and a relatively white portion, but it is considered that the white and the black in the columnar hard carbon layer do not indicate a density difference but indicate a tiny orientation difference. That is, the columnar hard carbon layer has a structure that the (002) surface is parallel to the substrate and the C axis perpendicular to the substrate but each columnar structure grows in a form of gradually slightly rotating, and it is considered that the bright-field TEM image having a color difference merely indicates observing the orientation difference but does not indicate a density difference. Moreover, the columnar hard carbon layer has a diffraction spot in electron beam diffraction, which is considered as crystalline.

The columnar hard carbon layer maintains fine particles and grows in the thickness direction, and the aspect ratio is great. The fine columnar structure with a great aspect ratio has extremely excellent in strength, which thus not only can improve low-friction properties but also can improve chipping properties. Moreover, the hard carbon structure columnarized in the thickness direction is more resistant to peeling, and thus can give play to excellent peeling resistance. Then, the hard carbon finely columnarized has excellent wear resistance.

As a result, in a situation where such a hard carbon film coats a surface of a sliding member, the low-friction properties, the wear resistance, the chipping resistance, and the peeling resistance can be significantly enhanced compared with the coating of the existing hard carbon film.

In addition, such hard carbon growing in columns-shape perpendicular to the substrate forms a film preferably using a PVD method.

That is, the hard carbon may also form a film using a CVD method all the time, but in the case of the CVD method, the film-forming temperature is high, and thus it is not suitable for serving as a film-forming method of forming high-density hard carbon. The inventor finds from results of the study that the hard carbon film with that structure can be formed by using a PVD method and properly controlling the film-forming temperature. In addition, hydrogen-containing gas raw materials are used in the CVD method, and thus the hardness of the film is reduced easily and low-friction properties in the oil are also poor. However, solid carbon raw materials are used at the cathode in the PVD method, which thus has the following advantage: the hard carbon with high hardness not containing hydrogen or impure metal and has excellent low-friction properties in the oil can form a film.

Moreover, when the hard carbon layer is measured using Raman spectroscopy, if the ID/IG ratio of the Raman spectrum D band peak area intensity and G band peak area intensity is too great, it is easy to reduce the wear resistance; on the other hand, if the ID/IG ratio is too small, the improved effect of the chipping resistance is insufficient. The inventor finds from results of the study that the ID/IG ratio is preferably 1-6, and more preferably 1.5-5. By controlling the ration to be within such a range, the wear resistance and the chipping resistance can be sufficiently balanced.

The invention recited in the technical solution 1, based on the understanding, is a coating film coated on a substrate surface, wherein a hard carbon layer is formed continuing in columns-shape perpendicular to the substrate when observed in a cross-sectional bright-field TEM image, the hard carbon layer is formed using a PVD method, and the ID/IG ratio is 1-6 when the hard carbon layer is measured using Raman spectroscopy, said ratio being the ratio of the Raman spectrum D band peak area intensity and G band peak area intensity.

The invention recited in the technical solution 2 is the coating film according to the technical solution 1, wherein the hard carbon continuing in columns-shape perpendicular to the substrate has a width of 1 nm to 500 nm.

The ability for absorbing shock from the outside can be increased by thinning the width of the hard carbon continuing in columns-shape perpendicular to the substrate (the line width of the hard carbon constituting a columnar shape). In addition, if the width of the hard carbon becomes thin, the structure becomes thin, and thus the wear resistance is increased. As a result, a coating film with excellent balance of chipping resistance and wear resistance can be provided. The width is preferably 1 nm to 500 nm, and more preferably 3 nm to 60 nm.

The invention recited in the technical solution 3 is the coating film according to the technical solution 1 or technical solution 2, wherein the hard carbon continuing in columns-shape perpendicular to the substrate displays a diffraction spot in electron beam diffraction of the cross section of the coating film.

The hard carbon continuing in columns-shape perpendicular to the substrate displays a diffraction spot in electron beam diffraction of the cross section of the coating film and is crystalline, and thus chipping resistance in the case of loading repeated stress or positive or negative stress is increased and the wear resistance is increased. Moreover, the aspect ratio is preferably 2-300.

The invention recited in the technical solution 4 is the coating film according to any of the technical solution 1 to the technical solution 3, wherein the hard carbon continuing in columns-shape perpendicular to the substrate displays a diffraction spot in a position at lattice spacing of 0.3 nm to 0.4 nm in electron beam diffraction of the cross section of the coating film.

In the case of the hard carbon perpendicular to the substrate that displays a diffraction spot in a position of 0.3 nm to 0.4 nm in electron beam diffraction of the cross section of the coating film, alignment is carried out by stacking graphite or graphene C surface, (002) surface, and thus the lubricity is increased. In addition, by stacking the (002) surface, the conductivity of the columnar hard carbon layer in the thickness direction becomes low, and the conductivity in a direction perpendicular to the thickness direction also has multiple crystal boundaries due to columnarization of fine crystalline particles. Therefore, if measurement is carried out using a bi-terminal method, the resistance of 1 Ω·cm to 1000 Ω·cm is also displayed even if the coating film coats a conductor.

The invention recited in the technical solution 5 is the coating film according to any of the technical solution 1 to the technical solution 4, wherein the hydrogen content of the columnar hard carbon layer is below 10 atom %.

By comparing the hard carbon layer with more hydrogen content with the hard carbon layer not containing hydrogen, the friction reduction effect in the oil is low, and it is easy to reduce the hardness and the wear resistance. In the case that the hydrogen content is below 10 atom %, the hard carbon layer becomes high hardness on the whole, and thus the wear resistance can be improved. The hydrogen content is preferably below 5 atom %. Then, in addition to the hydrogen, regarding N or B, Si or other metal elements, preferably, the elements are not contained other than inevitable impurities.

The invention recited in the technical solution 6 is the coating film according to any of the technical solution 1 to the technical solution 5, wherein the nano indentation hardness of the columnar hard carbon layer is 10 GPa to 35 GPa.

If the nano indentation hardness is too great, it is easy to reduce the chipping resistance. On the other hand, if the nano indentation hardness is too small, the wear resistance is easy to become insufficient. More preferably, the nano indentation hardness is 15 GPa to 30 GPa, which can especially increase the chipping resistance effectively.

The invention recited in the technical solution 7 is the coating film according to any of the technical solution 1 to the technical solution 6, wherein the $sp^2/sp^3$ ratio of the hard carbon continuing in columns-shape perpendicular to the substrate is 0.3 to 0.9.

If the $sp^2/sp^3$ ratio is too small, the improved effect of the chipping resistance is insufficient. On the other hand, if the $sp^2/sp^3$ ratio is too great, the wear resistance is reduced significantly. Preferably, the $sp^2/sp^3$ ratio is 0.3 to 0.9, and more preferably 0.4 to 0.8. By controlling the ratio to be within such a range, the chipping resistance and the wear resistance can be sufficiently balanced. In addition, when subject to high load or repeated load, the coating film is not easy to damage.

The invention recited in the technical solution 8 is the coating film according to any of the technical solution 1 to the technical solution 7, wherein the columnar hard carbon layer further has a lower non-columnar hard carbon layer, and the $sp^2/sp^3$ ratio of the lower hard carbon layer is 0.1 to 0.3.

The non-columnar hard carbon layer present in the lower layer of the columnar hard carbon layer is of higher density and excellent wear resistance because of containing more $sp^3$ bonding components, especially when the $sp^2/sp^3$ ratio is controlled to be within the range of 0.1 to 0.3, preferably 0.15 to 0.3, the wear resistance can be sufficiently increased.

Moreover, by setting such a hard carbon layer as a lower layer and stacking the columnar hard carbon layer with excellent chipping resistance to make a coating film of a two-layer structure, a coating film that can balance more excellent chipping resistance and excellent wear resistance can be provided.

The invention recited in the technical solution 9 is the coating film according to the technical solution 8, wherein the nano indentation hardness of the lower hard carbon layer is 35 GPa to 80 GPa.

If the nano indentation hardness of the lower hard carbon layer is 35 GPa to 80 GPa, the wear resistance of the coating film can be further increased, which is thus preferred.

The invention recited in the technical solution 10 is a manufacturing method for a coating film, using an arc PVD method, controlling the bias voltage, arc current, heater temperature and/or furnace pressure in a manner of maintaining a substrate temperature of 250-400° C., and coating the substrate surface with a hard carbon film while rotating and/or revolving the substrate, thus manufacturing the coating film according to any of the technical solution 1 to the technical solution 9.

The arc PVD method is a film-forming method that can generate active carbon particles with a high ionization rate and coating the same. By optimizing the bias voltage or arc current, heater temperature, furnace pressure and so on, white-colored hard carbon can be generated from the active carbon particles, and a columnar hard carbon layer is formed by taking it as a growth starting point.

The invention recited in the technical solution 11 is the manufacturing method for a coating film according to the technical solution 10, wherein the bias voltage is −275 V to −400 V.

During optimization of the parameters, a particularly important parameter is a substrate temperature controlled through a bias voltage, an arc current, and a heater.

That is, if the bias voltage is above −275 V, it is difficult to form the columnar hard carbon layer, and in the case that the bias voltage is below −400 V, it is easy to reduce the wear resistance of the columnar hard carbon layer.

Moreover, if the arc current is less than 10 A, discharge is difficult, and it is easy to reduce the wear resistance when the arc current is above 200 A.

In addition, if the substrate temperature is too low, it is difficult to form the columnar hard carbon layer, and it is easy to reduce the wear resistance of the columnar hard carbon layer when the substrate temperature is too high. The substrate temperature is preferably 250° C. to 400° C., and more preferably 250° C. to 350° C.

The invention recited in the technical solution 12 is a PVD device, for use in the manufacturing method for a coating film according to the technical solution 10 or 11, wherein the PVD device is an arc PVD device having a control mechanism that controls the substrate temperature of 250-400° C.

In a situation where the hard carbon is formed using an arc PVD method, depending on different bias voltages of the arc PVD device, sometimes a situation occurs that the substrate temperature is below 250° C. or the substrate temperature is above 400° C. during film-forming, the coating film with such a structure may not be formed.

Therefore, in the arc PVD device of the present invention, a control mechanism that can make control in a manner of maintaining a substrate temperature of 250-400° C., to uniformly heat the substrate at an appropriate temperature.

Regarding a specific control method, the following methods may be listed: a method of setting a heater for uniformly heating a substrate; or a method of importing a cooling mechanism on a fixture provided with a substrate; a method of automatically controlling a bias voltage or an arc current according to a substrate temperature monitored via a thermocouple and so on.

The invention recited in the technical solution 13 is the PVD device according to the technical solution 12, including:

a substrate supporting mechanism that supports the substrate to make it rotate and revolve freely; and a rotary control mechanism that controls the speed of rotation and/or revolution of the substrate.

By supporting the substrate to make it rotate and revolve freely and controlling it to rotate and revolve, the substrate can be heated more uniformly.

Effect of the Invention

According to the present invention, a coating film, a manufacturing method for the same, and a PVD device used in the manufacturing method that not only sufficiently improve the balance of low-friction properties and wear resistance, but also improve chipping resistance (defect resistance) and peeling resistance can be provided.

DESCRIPTION OF THE EXAMPLES

The present invention is described below according to implementation forms and with reference to the drawings.

1. Substrate

In the present invention, the substrate to form a coating film is not particularly limited, and in addition to iron-based substrates, non-iron-based metal or ceramic, hard composite and other substrates can be used. For example, carbon steel, alloy steel, quenched steel, high-speed tool steel, cast iron, aluminium alloy, Mg alloy or superhard alloy etc. can be listed, and if the film-forming temperature of the coating film is considered, a substrate whose characteristics are not significantly degraded at a temperature above 250° C. is preferred.

2. Intermediate Layer

When the coating film is formed, an intermediate layer is preferably preset on the substrate. Thus, adhesion between the substrate and the coating film may be increased, and in the case that the coating film is worn, the intermediate layer can be exposed to give play to the function of wear resistance.

At least one of Cr, Ti, Si, W, B and other elements can be employed for such an intermediate layer. In addition, nitride, carbon nitride, carbide and the like of at least one of Cr, Ti, Si, Al, etc. can be used in a lower layer of the elements, and such compounds, for example, include CrN, TiN, CrAlN, TiC, TiCN, TiAlSiN and the like.

3. Coating Film The coating film of the present invention forms a hard carbon layer in which hard carbon is continuing in columns-shape when observed in bright-field TEM image in a cross-sectional perpendicular to the substrate.

Figure 1:
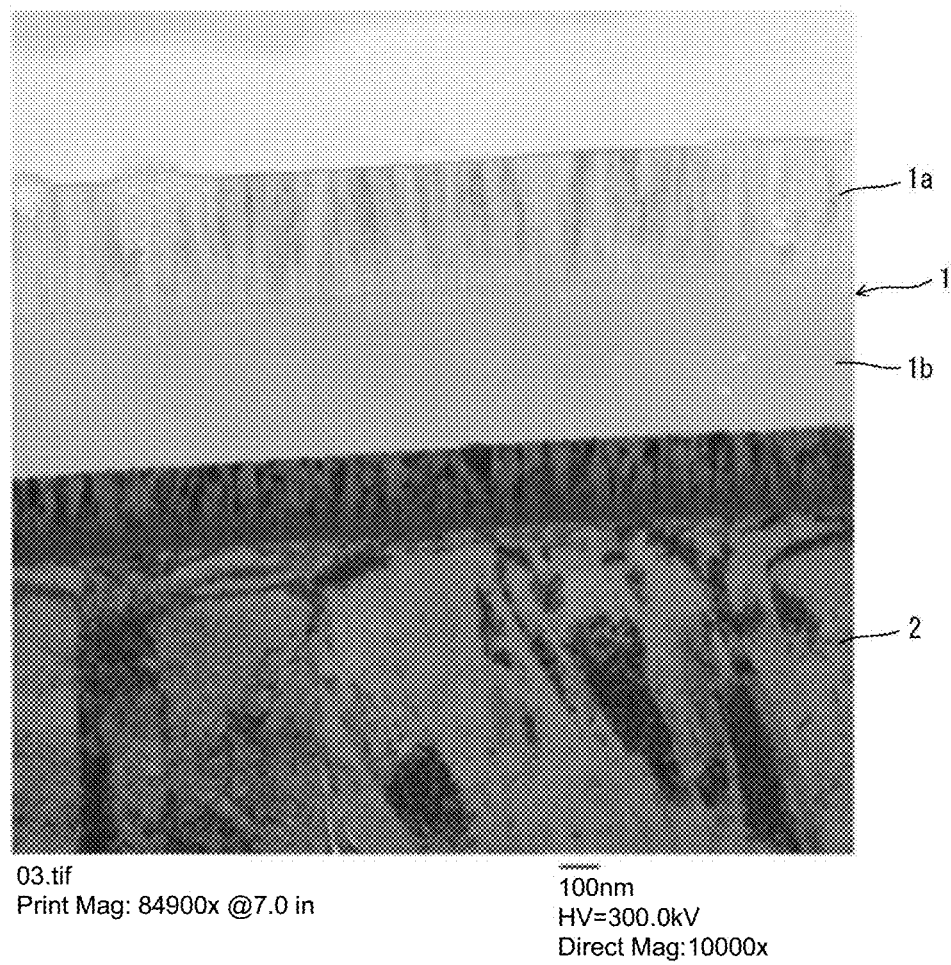
FIG. 1 is a cross-sectional bright-field TEM image of a coating film according to an implementation form of the present invention.
Figure 2:
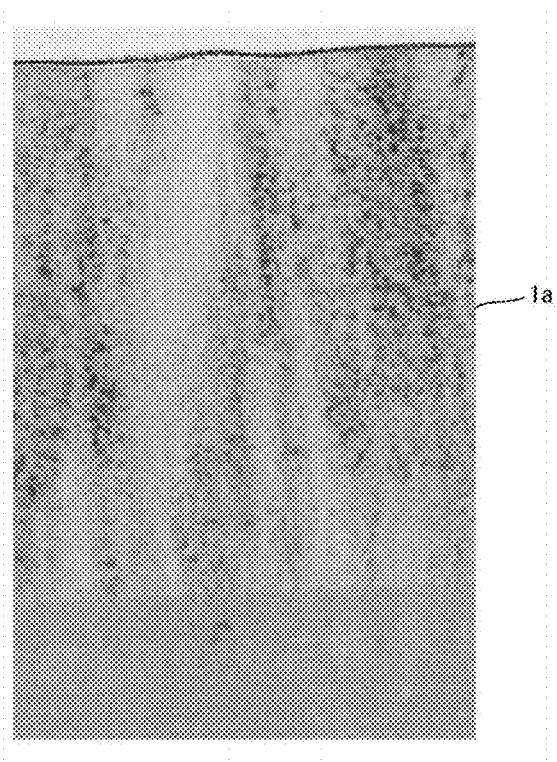
FIG. 2 is an enlarged view of one part of FIG. 1.

FIG. 1 is a cross-sectional bright-field TEM image of a coating film according to an implementation form of the present invention, and FIG. 2 is an enlarged view of one part of the bright-field TEM image of FIG. 1.

In FIG. 1, 1 is a coating film, and 2 is a substrate. It is obtained from FIG. 1 that, on an upper layer 1a (surface side) of the coating film 1, columnar hard carbon grows towards the surface of the coating film 1, and a non-columnar hard carbon layer is formed on a lower layer 1b of the coating film 1.

Also, a particle width of a hard carbon particle of the columnar hard carbon layer 1a can be measured through the bright-field TEM image of FIG. 2.

In the present invention, the hard carbon extending in columns-shape preferably has a width of 1 nm to 500 nm, and more preferably 3 nm to 60 nm, and has a diffraction spot (crystalline diffraction pattern) in electronic beam diffraction. In addition, the $sp^2/sp^3$ ratio is 0.3 to 0.9, and more preferably 0.4 to 0.8.

Besides, preferably, the columnar hard carbon displays a diffraction spot in a position at lattice spacing of 0.3 nm to 0.4 nm in electron beam diffraction of the cross section of the coating film.

In addition, the hydrogen content of the columnar hard carbon layer 1a is below 10 atom %, and more preferably below 5 atom %, and the remaining portion substantially only contains carbon. In addition to hydrogen, regarding N, B, Si and other metal elements, preferably the elements are not contained other than inevitable impurities. Besides, the nano indentation hardness is preferably 10 GPa to 35 GPa, and more preferably 15 GPa to 30 GPa, and the ID/IG ratio is 1-6, and more preferably 1.5-5.

On the other hand, the nano indentation hardness of the lower layer 1b is preferably 35 GPa to 80 GPa, and the $sp^2/sp^3$ ratio is 0.1 to 0.3, and more preferably 0.15 to 0.3.

4. Manufacturing Method of a Coating Film and Arc PVD Device (1) Manufacturing Method When the coating film 1 is formed, an arc PVD method, a sputtering PVD method and the like may be used, and particularly the arc PVD method is preferred.

In the case that the coating film is formed using the arc PVD method, a bias voltage or arc current is regulated, or the substrate is heated using a heater, or the substrate is cooled in a forced way by importing a cooling mechanism on a fixture (holder) provided with the substrate, and a manufacturing condition is adjusted in a manner of making the substrate temperature 250° C. to 400° C., and more preferably 250° C. to 350° C.

In addition, at this point, the bias voltage is preferably −275 V to −400 V, in addition to heating of the heater or cooling from the holder, the substrate temperature may also be controlled by changing the arc current, or applying a bias voltage intermittently such as discontinuously or pulse-like, which is not particularly limited.

In addition, during film-forming, preferably, the substrate rotates at 10 rpm to 200 rpm, or revolves at 1 rpm to 20 rpm.

Under such a manufacturing condition, although the reason for forming the columnar hard carbon layer is uncertain, the reason may be considered as follows.

That is, if a film is formed in a range that the substrate temperature is 250° C. to 400° C. and the bias voltage is −275 V to −400 V, when carbon ions flying out of a target varies impact the substrate, the hard carbon, affected by the high-temperature substrate and the great bias voltage, is prone to crystal growth in a certain direction. Therefore, the hard carbon layer is easy to grow into a columnar hard carbon layer.

If the columnarized hard carbon is analyzed through electronic beam diffraction, a weak diffraction spot is observed in a position of 0.3 nm to 0.4 nm. It can be considered that the position is equivalent to the graphite or graphene c surface, that is, (002) surface having a $sp^2$ structure, the columnar hard carbon having such a diffraction spot can particularly improve the low-friction properties as the graphene c surface is aligned in a direction parallel to the substrate.

In addition, hereinabove, the reasons for setting the substrate temperature to be 250° C. to 400° C. are as follows: in the case of below 250° C., even if the carbon ions are incident into the substrate from the front, they are difficult to grow in columns-shape; on the other hand, in the case of above 400° C., although the carbon ions are columnarized, the hardness is reduced, and it is easy to reduce the wear resistance.

Also, as stated hereinabove, in addition to adjusting the bias voltage, the substrate temperature can be adjusted by adjusting the arc current, the heater temperature, the furnace pressure and the like; however, if the following situation is considered: it is difficult to form a columnar hard carbon layer if the bias voltage is over −275 V, and it is easy to reduce wear resistance if the bias voltage is less than −400 V, the bias voltage is preferably −275 V to −400 V, and more preferably −275 V to −380 V. In addition, regarding the furnace pressure, in the case of a vacuum environment set as $10^{-4}$ Pa to $5 \times 10^{-1}$ Pa, compared with the situation where hydrogen or nitrogen is imported, a low-friction and high-wear-resistance hard carbon film can be obtained, which is thus preferred.

With respect to the present invention, in the existing manufacturing method of a hard carbon film, especially in the case that a film is formed using an arc PVD method, in order to form a high-density coating film, the bias voltage is generally controlled, to form a film under a condition that the substrate temperature is above 200° C. and does not rise.

In addition, for example, in Japanese Patent Publication Gazette No. 2007-169698, the following technology is put forward: the bias voltage is set as −500 V to −1000 V, and after the inner layer (lower layer) is coated in the bright-field TEM image to be visible as a white layer, under a condition that the bias voltage is −100 V, a hard carbon layer darker than the inner layer in the bright-field TEM image forms a film in the upper layer thereof; however, tilting the density of the hard carbon film in the thickness direction by controlling the bias voltage is not disclosed herein, it is impossible to form a structure of columnar hard carbon highly controlled, and it is impossible to manufacture, like the hard carbon film of the present invention, a coating film which sufficiently balances low-friction properties and wear resistance, has excellent sliding characteristics and also has sufficiently excellent chipping resistance and peeling resistance.

The coating film in the implementation form can be manufactured using an arc PVD device, and a specific film-forming device, for example, may be an arc PVD device M720 manufactured by the Japanese ITF Company.

In the following, manufacturing of a coating film using the arc PVD device is specifically described.

At first, after CrN coats a metal raw material becoming a substrate with a thickness of 10 μm, the substrate is taken out of the PVD device, to be ground in a manner that the surface roughness Rz becomes 0.3 μm. Then, the substrate is set in an arc PVD device having a rotating and revolving fixture.

Next, the magnitude of the bias voltage or the arc current is adjusted, or the time of becoming a non-bias voltage is intermittently imported to cool the substrate, or the substrate is heated using a heater, or the substrate is rotated, to make control in a manner that the substrate temperature is about 250-400° C., such that the hard carbon film grows in columns-shape.

As stated hereinabove, the detailed film-forming mechanism of the present invention is unknown, but it can be considered that, by placing the substrate temperature in such a high temperature environment and setting the bias voltage as a low value below −275 V, the hard carbon grows in columns-shape perpendicular to the substrate.

(2) Arc PVD Device

Figure 3:
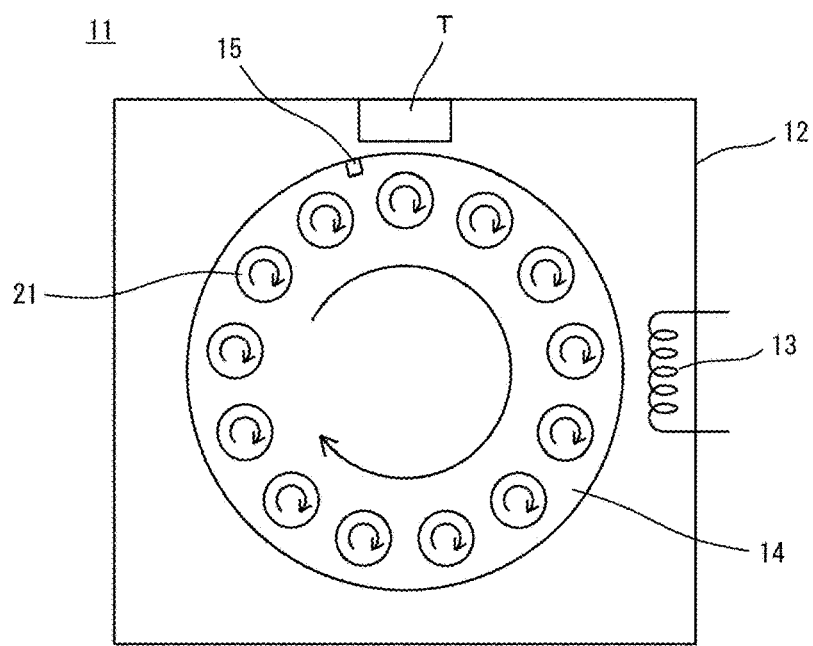
FIG. 3 is a diagram that schematically indicates main parts of a furnace for use in film-forming of a manufacturing device according to an implementation form of the present invention.

Then, the arc PVD device of the implementation form is specifically described. FIG. 3 is a diagram that schematically indicates main parts of a furnace for use in film-forming of the arc PVD device according to the implementation form.

The arc PVD device includes a furnace 11 for use in film-forming and a control device (not shown). In the furnace 11, a vacuum chamber 12, a plasma generation device (not shown), a heater 13, a rotating and revolving fixture 14 as a substrate supporting device, a thermocouple (T.C.10 mm square bar) 15 as a thermometer measuring device, a bias power source (not shown) and a pressure adjusting device (not shown) that adjusts the pressure in the furnace.

In addition, preferably, a cooling heating device that supplies cooling water and/or warm water or steam is provided on the substrate supporting device. In addition, T is a target (carbon target), and 21 is a substrate (iron substrate) with an intermediate layer formed thereon. In addition, actually there are 5 targets T, but for the sake of simplification, only 1 target is depicted in FIG. 3.

The plasma generation device includes an arc power source, a cathode and an anode, by discharge through a vacuum arc between the cathode and the anode, carbon is evaporated from the carbon target T as a cathode material, and a plasma containing an ionized cathode material (carbon ions) is generated. The bias power source applies a fixed bias voltage to the substrate 21 to make the carbon ions fly towards the substrate 21 with suitable kinetic energy.

The rotating and revolving fixture 14 is disk-like, and freely rotates in the arrow direction with the center of the circle as a rotation center; on concentric circles with the center of the disk as the center, multiple rotary shafts perpendicular relative to the disk are provided at an equal interval. Multiple substrates 21 are retained by the rotary shafts respectively, and freely rotate in the arrow direction. Thus, the substrates 21 are retained on the rotating and revolving fixture 14 to rotate and revolve freely. In addition, for the rotating and revolving fixture 14, a metal material with high thermal conductivity such as stainless steel is used in a manner of quickly transferring heat between the substrates 21 and the rotating and revolving fixture 14 and making temperatures of the substrates 21 and the rotating and revolving fixture 14 substantially equal.

The heater 13 and the cooling and heating device heat and cool the rotating and revolving fixture 14 respectively, thus indirectly heating and cooling the substrates 21. Here, the heater 13 is formed in a manner of regulating the temperature. On the other hand, the cooling and heating device is formed in a manner of adjusting a supply speed of a cooling and heating medium. Specifically, the cooling device is formed in a manner of supplying the cooling water for the rotating and revolving fixture 14 and/or the rotary shaft during implementation of cooling and stopping supplying the cooling water when the cooling stops, and is formed in a manner of supplying warm water or steam for the rotating and revolving fixture 14 and/or the rotary shaft during heating and stopping supplying the warm water or steam when the heating stops. In addition, the thermocouple 15 is installed near the substrate 21, and is formed in a manner of indirectly measuring the substrate temperature to make at least one of the arc current value, the bias voltage value, and the heater temperature change in film-forming, thus controlling the substrate temperature to be a target substrate temperature.

Regarding the speed of the rotating and revolving fixture 14, the control device controls various speeds to be a fixed speed under a preselected combination of rotation and revolution in a manner of reliably forming a columnar hard carbon layer and also in a manner of forming a film without bias. In addition, according to the measurement results of the thermocouple 15 for the temperature of the substrate 21, the bias voltage, the arc current, the heater temperature, and the furnace pressure are optimized. Thus, the temperature of the substrate 21 during film-forming can be maintained within a temperature range of 250-400° C. Also, the work of the cooling device and the applied pattern of the bias voltage are controlled as required.

For example, a feedback system is preferably added, and the feedback system measures substrate temperatures in upper, middle and lower segments, properly changes arc current values in various positions of the upper, middle and lower segments during film-forming according to measured values, and set the substrate temperatures in various positions of the upper, middle and lower segments as a target temperature. Thus, stabilization of a film structure of hard carbon films of the upper, middle and lower segments can be achieved. In addition, in the film-forming of the existing hard carbon film, for film-forming parameters such as bias voltage, arc current and the like, in most cases, predetermined values are input into the control device before film-forming, film-forming is conducted under a pre-programmed film-forming condition, and there is no film-forming method and device that changes the arc current or heater temperature according to the substrate temperature measured in the middle of film-forming. Therefore, temperatures in the furnace or temperatures between batches are more non-uniform than the method of the present invention.

5. Inspection Method of Coating Film (1) Observation of TEM Structure

Through a TEM, a coating film thin-filmed using a Focused Ion Beam (FIB) is observed, for example, in a bright-field TEM image at an acceleration voltage of 300 kV.

(2) Measurement of Hydrogen Content

The hydrogen content in the coating film is measured through Hydrogen Forward Scattering (HFS) analysis.

(3) Judgment Method of Crude Density of the Hard Carbon Layer

The density of the hard carbon film may generally be measured using a Grazing Incidence X-ray Analysis (GIXA) method or a Grazing Incidence X-ray Reflectivity (GIXR) method. However, in a situation where small-density crude hard carbon and large-density dense hard carbon in the hard carbon layer are dispersed finely, it is difficult to utilize the method to measure density of various portions with high precision.

For such a hard carbon layer, for example, a method of effectively utilizing brightness of a bright-field TEM image disclosed in Japanese Patent Gazette No. 4918656 can be used. Specifically, in the bright-field TEM image, the lower the density is, the more the penetration amount of the electron beam increases. Therefore, in the case of forming the same substance, the lower the density is, the whiter the image is. So, in order to judge the density of each layer in multiple hard carbon layers of the same composition, preferably, a cross-sectional bright-field TEM image of the structure of the hard carbon layer is used.

In the case of the bright-field TEM image of FIG. 1, the hard carbon layer of the surface portion becomes a columnar structure, but the columnar structure is not observed in a hard layer of the inner layer portion.

(4) Crystalline Judgment Method of the Coating Film

The coating film formed by thin-filming the cross section using FIB carries out electron beam diffraction of the cross section of the coating film under a condition of an acceleration voltage of 200 kV, a sample absorption current $10^{-9}$ A, and a beam spot size of 0.7 nm$\phi$, to obtain an image of a tiny beam diffraction pattern, if the image is a diffuse scattering pattern, it is judged as amorphous, and if a spot-like pattern is observed and judged to be crystalline, intensity spacing L near the spot is measured, and lattice spacing $\lambda$ (nm) is calculated according to a relation that $2L\lambda$=camera length.

(5) Measuring Method of the ID/IG Ratio Obtained by Raman Spectroscopy

The hard carbon layer may be obtained by separating peaks of Raman spectrum obtained through Raman spectroscopy. Specifically, the peak position of the D band is fixed to 1350 cm$^{-1}$ for selection, the area intensity of this peak is set as ID, the peak position of the G band is near 1560 cm$^{-1}$ for free setting and peak separation, the area intensity of this peak is set as IG, and the ID/IG ratio is calculated.

(6) Measuring Method of the sp$^2$/sp$^3$ Ratio

The sp$^2$/sp$^3$ ratio can be calculated by calculating sp$^2$ intensity and sp$^a$ intensity through Electron Energy-Loss Spectroscopy (EELS). Specifically, with a spectral imaging method in a STEM (scanning TEM) mode, under a condition of an acceleration voltage of 200 kv, a sample absorption current of $10^{-9}$ A, and a beam spot size of $\phi$1 nm, EELS obtained at an interval of 1 nm is accumulated, to extract a C-K absorption spectrum in the form of average information from a region of about 10 nm, and the sp$^2$/sp$^3$ ratio is calculated. If the measuring method is used, the sp$^2$/sp$^3$ ratio in a tiny portion can be measured; as the sp$^2$/sp$^3$ ratio of the high-density hard carbon is less than that of the low-density hard carbon, the judgment method of crude density of hard carbon can be substituted.

(7) Measuring Method of Conductivity of the Columnar Hard Carbon Layer

A certain current flows between terminals with a bi-terminal method, and voltage reduction between two terminals is measured, to calculate the resistance and measure the resistance of the coating film.

(8) Measuring Method of Nano Indentation Hardness

The nano indentation hardness is measured using a Nanoindenter ENT1100a manufactured by Elionix Company under a condition of a load of 300 mgf, the load partition number of 500, and a load loading time of 1 s.

In addition, in the case that the columnar hard carbon layer is the uppermost layer, the nano indentation hardness can be measured from the film surface, and in the case that another coating layer instead of the uppermost layer is provided, the nano indentation hardness is measured after the cross section of the film is mirror-polished. In addition, regarding the film in the lower layer, the nano indentation hardness is also measured from the cross section of the film.

6. Effect of the Implementation Form

As stated above, the coating film of the present invention has a columnar hard carbon layer which is a very special structure not seen in the existing hard carbon layer, that is, hard carbon grows in columns-shape in the thickness direction of the hard carbon layer.

Moreover, the columnar hard carbon is excellent in intensity by becoming a crystalline structure with a great aspect ratio, and thus has excellent chipping resistance. In addition, as it becomes a structure successively connected in the thickness direction, it is more resistant to peeling. Then, by aligning the graphite c surface in a direction parallel to the substrate, particularly excellent low-friction properties can be displayed.

Then, the hard carbon is columnarized finely, and thus can increase wear resistance.

As a result, low-friction properties and wear resistance can be sufficiently balanced, sliding characteristics can be significantly increased compared with the existing coating film, and chipping resistance and peeling resistance can also be more increased than the existing coating film.

7. Other Coating Films

In addition, in the coating film of the implementation form, as shown by FIG. 1 as a cross-sectional bright-field TEM image, on an upper layer 1*a* (surface side) of the coating film 1, columnar hard carbon grows towards the surface of the coating film 1, and a non-columnar hard carbon layer is formed on a lower layer 1*b* of the coating film 1.

However, the inventor conducts further research and accordingly obtains that, by making various changes to the growing condition of the hard carbon film, sometimes, a lower layer side of the columnar hard carbon layer growing in columns-shape has a coating film of a mesh-shaped hard carbon layer growing into a mesh shape. Particularly, if the substrate is rotated during film-forming, it is easy to form a mesh-shaped hard carbon layer due to repeated heating and cooling.

That is, a coating film is discovered, coating a substrate surface, wherein a columnar hard carbon is formed extending in columns-shape in the thickness direction when observed in a cross-sectional bright-field TEM image, on the substrate surface, a lower layer side of the columnar hard carbon has a hard carbon that presents relatively black and white when observed in the cross-sectional bright-field TEM image, white-colored hard carbon is in a mesh shape extending in the thickness direction, black-colored hard carbon forms a mesh-shaped hard carbon layer dispersed into the cavities in the mesh, the columnar hard carbon layer and the mesh-shaped hard carbon layer are both formed using a PVD method, and the ID/IG ratio is 1-6, said ratio being the ratio of the Raman spectrum D band peak area intensity and G band peak area intensity is 1-6 when the columnar hard carbon layer and the mesh-shaped hard carbon layer are measured using Raman spectroscopy.

The mesh-shaped hard carbon layer is displayed in the bright-field TEM image, the white-colored hard carbon is of relatively low density, and the black-colored hard carbon is of relatively high density.

Moreover, the low-density white-colored hard carbon is soft, and is more resistant to impact and excellent in low-friction properties compared with the high-density black-colored hard carbon. Therefore, by connecting the white-colored hard carbon in the thickness direction to become a three-dimensional connected structure, the stress applied from the outside can be effectively dispersed, which not only can increase the low-friction properties but also can increase the chipping resistance.

In addition, the structure that the low-density white-colored hard carbon is successively connected in the thickness direction is more resistant to the peeling, and thus such a hard carbon film can give play to excellent peeling resistance.

Then, the high-density black-colored hard carbon dispersed into the cavities of the low-density white-colored hard carbon is harder than the white-colored hard carbon, and thus the wear resistance is increased.

As a result, in a situation where such a hard carbon film coats a surface of a sliding member, the low-friction properties, the wear resistance, the chipping resistance, and the peeling resistance can be significantly enhanced compared with the coating of the existing hard carbon film.

Thus, by forming a mesh-shaped hard carbon layer growing in mesh-shaped on a lower layer side of the columnar hard carbon layer growing in columns-shape, compared with the situation where only the columnar hard layer is formed, further improvement of the low-friction properties, the wear resistance, the chipping resistance, and the peeling resistance can be expected.

Example

Then, the present invention is more specifically described according to an example.

1. Manufacturing of a Friction-Wear Test Sample
(1) Forming of a Substrate and an Intermediate Layer A substrate (in line with a material of SWOSC-V) was prepared, to form a piston ring shape with a diameter (φ) of 80 mm, a ring radial-direction width (a1) of 2.6 mm, a ring axial-direction width (h1) of 1.2 mm, grinding was carried out after a CrN layer having a thickness of 10 μm coated the surface of the sliding plane using an arc PVD device, and a CrN layer coated steel substrate having surface roughness Rz of 0.3 μm was prepared.

(2) Forming of a Coating Film

Figure 4:
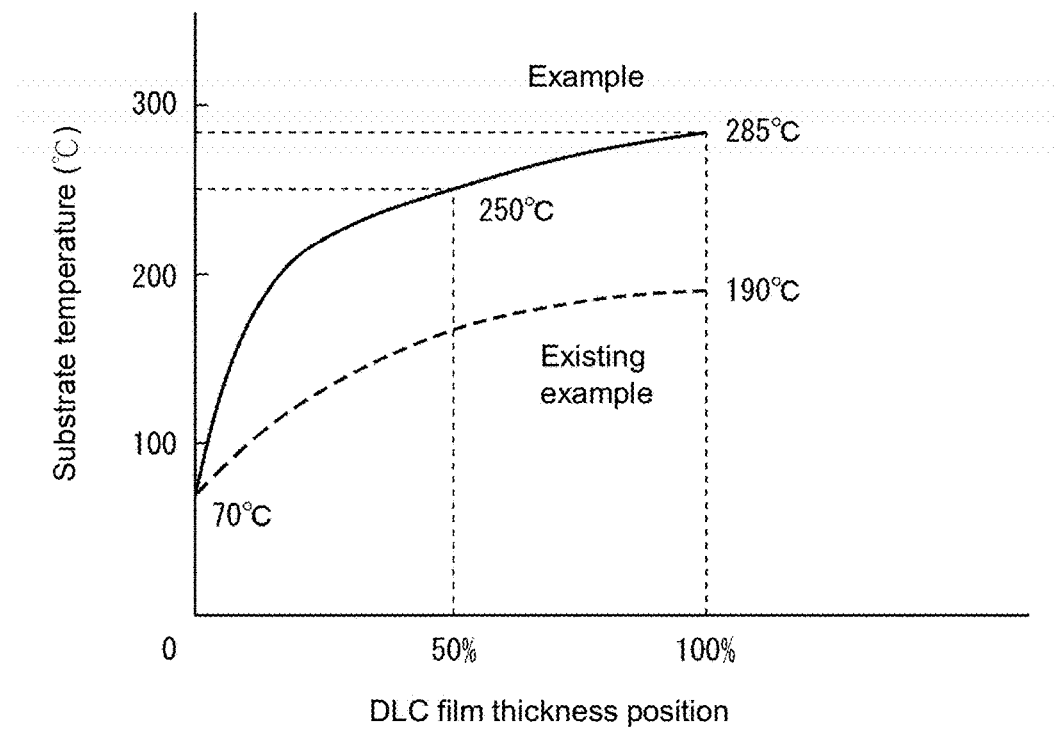
FIG. 4 is a diagram that conceptually indicates changes of the substrate temperature when the coating film is formed according to an example of the present invention and the existing example.

Next, an arc PVD device including a film-forming furnace 11 shown in FIG. 3 was used, a Cr intermediate layer having a thickness of 0.2 μm and a hard carbon film having a thickness of 0.9 μm were formed on the CrN layer coated steel substrate under a film-forming condition as shown below, and samples of the example and the existing example were made. FIG. 4 is a diagram that conceptually indicates changes of the substrate temperature when the coating film is formed according to the example and the existing example, in which the horizontal axis is the DLC film growing thickness denoted by %, and the vertical axis is the substrate temperature in this case.

It can be obtained from FIG. 4 that, in the example, the substrate temperature is 250° C. when the DLC film grows to 50%, and the substrate temperature reaches 285° C. when the DLC film grows to 100%. Relative to this, it can be obtained: in the existing example, the substrate temperature is about 175° C. when the DLC film grows to 50%, and the substrate temperature stops at 190° C. when the DLC film grows to 100%.

(a) Example

After the CrN layer coated steel substrate was configured on the rotating and revolving fixture 14 as a substrate supporting device, it was disposed in the furnace 11 of the arc PVD device, a metal Cr layer having a coating thickness of 0.2 μm was used as the intermediate layer, the heater 13 was heated to 250° C., arc discharge was conducted at 12 kW (−300 V, 40 A), and the hard carbon was coated with carbon cathode. Through rotation of the rotating and revolving fixture 14 (rotate at 39 rpm and revolve at 4 rpm), the arc current was controlled in a manner of continuously raising the temperature of the substrate 21 in the furnace 11 from 70° C. at the beginning of the film-forming to the highest temperature 285° C. at the later stage of the film-forming.

(b) Existing Example

The bias voltage in the hard carbon film-forming was set as −75 V, the substrate temperature during film-forming is controlled to be 70° C. to 200° C. by cooling in the middle of insertion, and in addition, film-forming was conducted similarly as the example.

Surfaces of the samples obtained were ground once again, and after the surface roughness Rz was adjusted to 0.15 μm, the following evaluation was made.

2. Evaluation of the Coating Film
(1) Observation of a Bright-Field TEM Image

A cross-sectional bright-field TEM image of the coating film formed perpendicular to the substrate was observed. Observation results were shown in Table 1.

TABLE 1

|  | TEM structure observed |
| --- | --- |
| Example | Substrate side (lower layer): a non-columnar carbon layer having a thickness of 0.5 μm<br>Surface side (upper layer): a columnar hard carbon layer having thickness of 0.4 μm |
| Existing example | a non-columnar hard carbon layer having a thickness of 0.9 μm |

As shown in Table 1, it is confirmed that, in the example, a columnar hard carbon layer is formed on the non-columnar hard carbon layer. In addition, it is confirmed that the particle width of the columnar hard carbon layer is 5 nm to 100 nm, and mainly 10 nm to 30 nm.

The reason for forming such a columnar hard carbon layer is as follows: under a bias voltage of −300 V, as shown in FIG. 4, when the coating temperature of the substrate is less than 250° C., a lower layer is formed first at the beginning of the film-forming, and under a condition of a temperature controlled to be above 250° C. (which is 260° C. to 285° C. in the example), an upper layer is formed.

On the other hand, it is confirmed that, in the existing example, the columnar hard carbon layer is not formed.

(2) Measurement of Resistance, ID/IG Ratio, Electron Beam Diffraction of the Cross Section of the Coating Film, Hydrogen Content, Nano Indentation Hardness and the $sp^2/sp^3$ Ratio The resistance of the upper layer (columnar hard carbon layer), the ID/IG ratio, crystallinity obtained from electron beam diffraction, hydrogen content, nano indentation hardness, and the $sp^2/sp^3$ ratio are measured for the coating film of the example. In addition, the measurement of the crystallinity obtained from electron beam diffraction and the measurement of the $sp^2/sp^3$ ratio are conducted on both the upper columnar hard carbon and the lower non-columnar hard carbon. In addition, the nano indentation hardness and the sp$^2$/sp$^3$ ratio of the lower hard carbon layer are also measured. The measurements results are shown in Table 2.

TABLE 2

|  | Example | | Existing example |
|---|---|---|---|
|  | Upper layer (columnar hard carbon layer) | Lower layer (Non-columnar hard carbon) |  |
| Resistance (Ω · cm) | 10-50 | | 10K-30K |
| ID/IG ratio | 2.5 | 0.5 | 0.5 |
| Electron beam diffraction of the cross section of the coating film | Have a diffraction spot in a position of 0.3-0.4 | Scattering pattern | Scattering pattern |
| Hydrogen content (atom %) | 0 | 0 | 0 |
| Nano indentation hardness (GPa) | 20 | 58 | 60 |
| sp$^2$/sp$^3$ ratio | 0.45-0.75 | 0.15-0.30 | 0.18-0.22 |

It is confirmed from Table 2 that, in the example, the resistance, the nano indentation hardness and, the ID/IG ratio, electron beam diffraction, and the sp$^2$/sp$^3$ ratio of the upper layer (columnar hard carbon layer), the nano indentation hardness and the sp$^2$/sp$^3$ ratio of the lower layer meet the requirements of the main technical solutions of the present invention respectively.

(3) Friction-Wear Test

Figure 5:
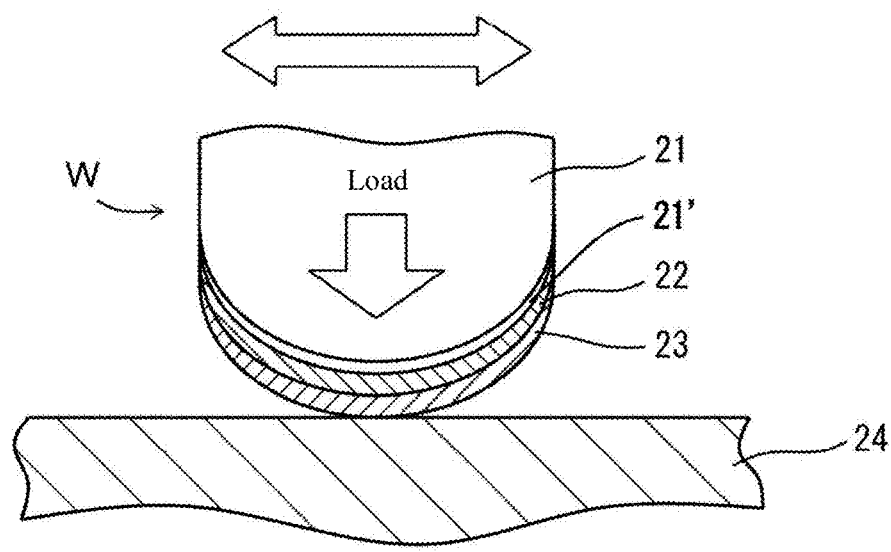
FIG. 5 is a diagram that schematically indicates a friction-wear testing method.

Then, a friction-wear test using a SRV (Schwingungs Reihungund und Verschleiss) tester generally conducted in the evaluation of automobile sliding members is conducted on the coating film. Specifically, as shown in FIG. 5, in a state that a sliding surface of a friction-wear test sample W abuts against a SUJ2 material 24 as a sliding object, loads of 100 N and 1000 N are applied to make it slide back and forth, and the sliding surface of the friction-wear test sample W is observed using a microscope. In addition, in FIG. 5, 22 is an intermediate layer, and 23 is a coating film. In addition, 21' is CrN.

Figure 6:
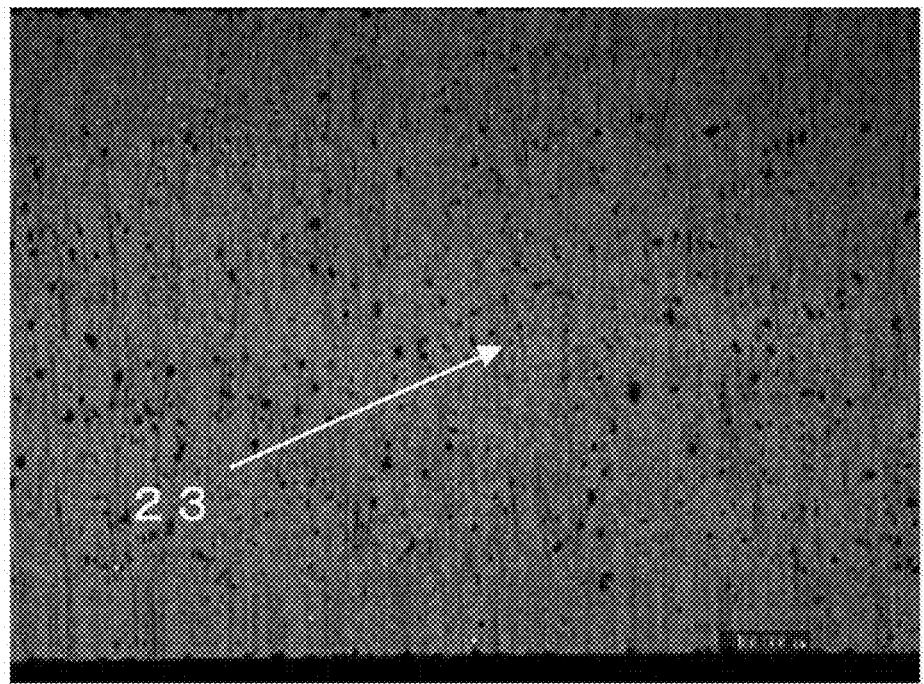
FIG. 6 is a microscope photo that indicates a friction-wear testing result according to an example of the present invention.
Figure 7:
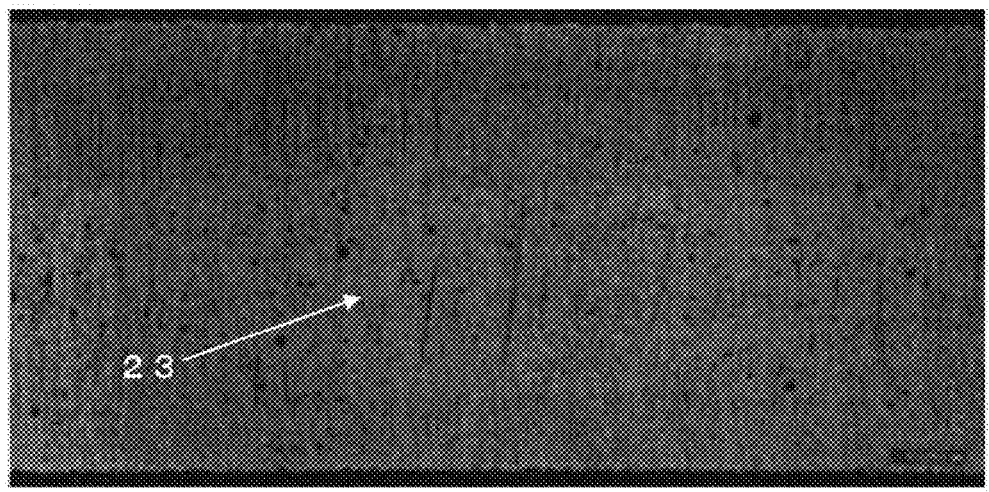
FIG. 7 is a microscope photo that indicates a friction-wear testing result according to an example of the present invention.
Figure 8:
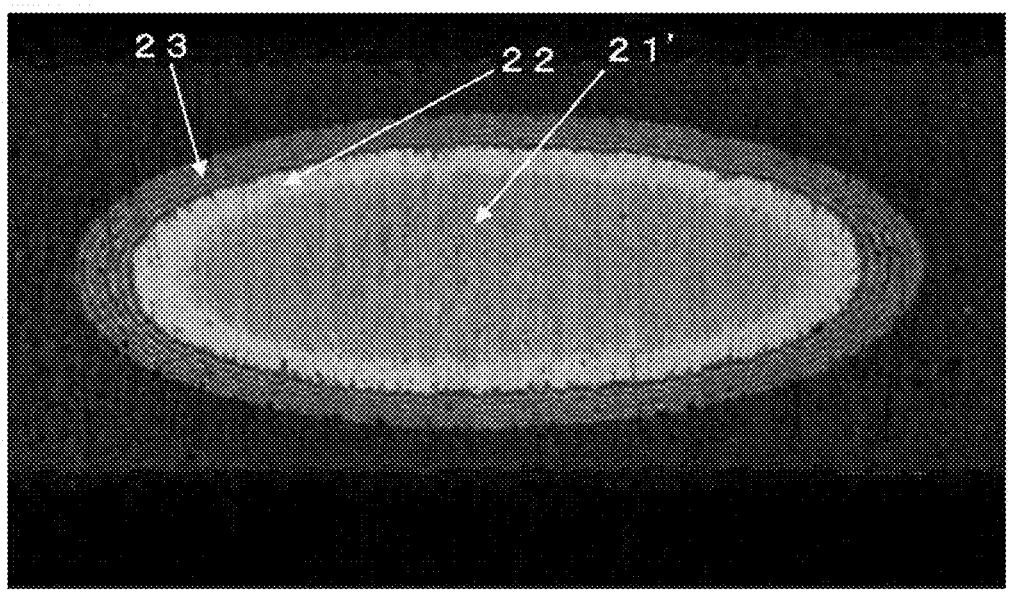
FIG. 8 is a microscope photo that indicates a friction-wear testing result according to the existing example.
Figure 9:
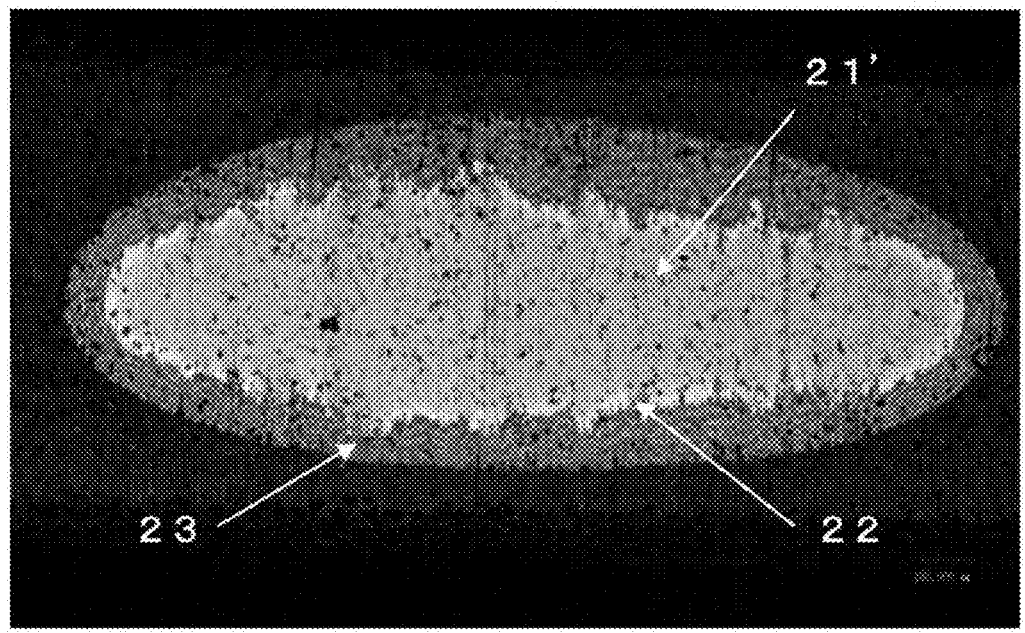
FIG. 9 is a microscope photo that indicates a friction-wear testing result according to the existing example.

An example of the testing result is shown in FIG. 6 to FIG. 9. FIG. 6 is a microscope photo of a sliding surface after 10-minute sliding with a load of 100 N according to the example, and FIG. 7 is a microscope photo of a sliding surface after 1-hour sliding with a load of 1000 N according to the example. In addition, FIG. 8 is a microscope photo of a sliding test result after 10-minute sliding with a load of 100 N according to the existing example, and FIG. 9 is a microscope photo of a sliding surface after 1-hour sliding with a load of 1000 N according to the existing example. In addition, the light gray portion 23 of FIG. 6 and FIG. 7 is a hard carbon coating film, the central light gray portion 21' in FIG. 8 and FIG. 9 is CrN, and a nearly-white gray portion 22 therearound is an intermediate layer of Cr. A dark gray portion 23 therearound is a hard carbon coating film.

As shown in FIG. 7, it can be confirmed that, in the example, even if the coating film slides for 1 hour with the load of 1000 N, peeling of the hard carbon does not occur, and wear is stopped in the black-colored hard carbon coating film; the coating film of the example may not chip or peel even if used with a high load for a long time, and thus has excellent performance as a coating film.

On the other hand, it can be confirmed that, as shown in FIG. 8, in the existing example, at the time of sliding for 10 minutes with the load of 100 N, the hard carbon coating film rubs away due to chipping or peeling, and the CrN layer of the CrN layer coated steel substrate is exposed. Then, it can be confirmed that, as shown in FIG. 9, in the existing example, if the coating film slides for 1 hour with the load of 1000 N, similar to the load of 100 N, the hard carbon coating film rubs away due to chipping or peeling, and the CrN layer of the CrN layer coated steel substrate is exposed.

3. Other Coating Films

In addition, in the example, after the initial bias voltage is set as −170 V and the hard carbon layer is coated at a temperature of 200-300° C., the CrN layer is thinly coated midway, then, in a situation where the hard carbon layer is coated at a bias voltage of −350 V and a temperature of over 250° C., or in a situation where the hard carbon is coated at a bias voltage of −300 V after the initial bias voltage is set as −170 V and the substrate temperature is cooled to 150° C., a situation where a lower side of the hard carbon layer growing in columns-shape has a coating film of the columnar hard carbon layer growing in columns-shape is confirmed.

The above describes the present invention according to implementation forms, but the present invention is not limited to the implementation forms. Various changes can be made to the implementation forms within the same and equivalent scopes of the present invention.

DESCRIPTION ABOUT NUMERALS 1, 23: coating film
1a: columnar hard carbon layer
1b: lower layer
2, 21: substrate
11: furnace
12: vacuum chamber
13: heater
14: rotating and revolving fixture (substrate supporting device)
15: thermocouple
21': CrN
22: intermediate layer
24: SUJ2 material
T: target
W: friction-wear test sample

What is claimed is:

1. A coating film of a sliding member, coated on a substrate surface, wherein
a hard carbon layer is formed continuing in columns-shape perpendicular to the substrate when observed in a cross-sectional bright-field TEM image,
the hard carbon layer is formed using a PVD method,
the ID/IG ratio is 1-6 when the hard carbon layer is measured using Raman spectroscopy, said ratio being the ratio of the Raman spectrum D band peak area intensity and G band peak area intensity,
a nano indentation hardness of the columnar hard carbon layer is 10 GPa to 35 GPa, and
the columnar hard carbon layer consists of amorphous hard carbon, or consists of amorphous hard carbon and graphite crystals.

2. The coating film according to claim 1, wherein the hard carbon continuing in columns-shape perpendicular to the substrate has a width of 1 nm to 500 nm.

3. The coating film according to claim 1, wherein the hard carbon continuing in columns-shape perpendicular to the substrate displays a diffraction spot in electron beam diffraction of the cross section of the coating film.

4. The coating film according to claim 1, wherein the hard carbon continuing in columns-shape perpendicular to the substrate displays a diffraction spot in a position at lattice spacing of 0.3 nm to 0.4 nm in electron beam diffraction of the cross section of the coating film.

5. The coating film according to claim 1, wherein the hydrogen content of the columnar hard carbon layer is below 10 atom %.

6. The coating film according to claim 1, wherein the $sp^2/sp^3$ ratio of the hard carbon extending in columns-shape perpendicular to the substrate is 0.3 to 0.9.

7. The coating film according to claim 1, wherein the columnar hard carbon layer further has a lower non-columnar hard carbon layer, and the $sp^2/sp^3$ ratio of the lower hard carbon layer is 0.1 to 0.3.

8. The coating film according to claim 7, wherein the nano indentation hardness of the lower hard carbon layer is 35 GPa to 80 GPa.

9. A manufacturing method for a coating film, using an arc PVD method,
in a manner of maintaining a substrate temperature of 250-400° C.,
controlling the bias voltage, arc current, heater temperature and/or furnace pressure, and
coating the substrate surface with a hard carbon film while rotating and/or revolving the substrate,
thus manufacturing the coating film according to claim 1.

10. The manufacturing method for a coating film according to claim 9, wherein the bias voltage is −275 V to −400 V.

11. A PVD device, for use in the manufacturing method for a coating film according to claim 9, wherein
the PVD device is an arc PVD device having a control mechanism that controls the substrate temperature of 250-400° C.

12. The PVD device according to claim 11, comprising:
a substrate supporting mechanism that supports the substrate to make it rotate and revolve freely; and
a rotary control mechanism that controls the speed of rotation and/or revolution of the substrate.

* * * * *